(12) United States Patent
Seo et al.

(10) Patent No.: US 10,006,120 B2
(45) Date of Patent: Jun. 26, 2018

(54) PLASMA-ENHANCED CHEMICAL VAPOR DEPOSITION DEVICE AND METHOD OF MANUFACTURING DISPLAY APPARATUS USING THE SAME

(71) Applicant: Samsung Display Co., Ltd., Yongin-si, Gyeonggi-do (KR)

(72) Inventors: Junghan Seo, Yongin-si (KR); Sungmin Hur, Yongin-si (KR); Gyoseung Ku, Yongin-si (KR); Hyungjong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 15/099,557

(22) Filed: Apr. 14, 2016

(65) Prior Publication Data

US 2016/0372715 A1  Dec. 22, 2016

(30) Foreign Application Priority Data

Jun. 18, 2015 (KR) ........................ 10-2015-0086605

(51) Int. Cl.
| | |
|---|---|
| *H01L 21/00* | (2006.01) |
| *C23C 16/04* | (2006.01) |
| *C23C 16/458* | (2006.01) |
| *C23C 16/50* | (2006.01) |
| *C23C 16/455* | (2006.01) |
| *H01J 37/32* | (2006.01) |
| *H01L 51/00* | (2006.01) |

(52) U.S. Cl.
CPC .......... *C23C 16/042* (2013.01); *C23C 16/455* (2013.01); *C23C 16/458* (2013.01); *C23C 16/50* (2013.01); *H01J 37/3244* (2013.01); *H01J 37/32366* (2013.01); *H01L 51/0008* (2013.01)

(58) Field of Classification Search
CPC ...................................................... H01L 21/00
See application file for complete search history.

(56) References Cited

U.S. PATENT DOCUMENTS

2008/0141940 A1  6/2008  Hoffman
2013/0122197 A1  5/2013  Lee

FOREIGN PATENT DOCUMENTS

| KR | 10-2001-0001008 | 1/2001 |
| KR | 10-2002-0066707 | 8/2002 |
| KR | 10-2008-0055729 | 6/2008 |
| KR | 10-2013-0058312 | 6/2013 |

*Primary Examiner* — Marvin Payen
(74) *Attorney, Agent, or Firm* — Lewis Roca Rothgerber Christie LLP

(57) ABSTRACT

A plasma-enhanced chemical vapor deposition device includes: a sprayer to spray a gas onto a substrate; a lift to support a mask including a pattern through which the gas to be sprayed by the sprayer passes, and to raise or lower the mask; and a susceptor to support the substrate on which the gas to be passed through the mask is to be deposited, and to raise or lower the substrate, wherein the susceptor includes a first ground to electrically contact the mask during a deposition process during which the gas is deposited on the substrate.

20 Claims, 10 Drawing Sheets

PLASMA-ENHANCED CHEMICAL VAPOR DEPOSITION DEVICE AND METHOD OF MANUFACTURING DISPLAY APPARATUS USING THE SAME

CROSS-REFERENCE TO RELATED APPLICATION

This application claims priority to, and the benefit of, Korean Patent Application No. 10-2015-0086605, filed on Jun. 18, 2015, in the Korean Intellectual Property Office, the disclosure of which is incorporated herein in its entirety by reference.

BACKGROUND

1. Field

One or more aspects of exemplary embodiments relate to plasma-enhanced chemical vapor deposition devices, and methods of manufacturing display apparatuses by using the same.

2. Description of the Related Art

Each of semiconductor devices, display apparatuses, and electronic devices includes a plurality of thin layers. There are various methods of forming the plurality of thin layers. One method among them is a vapor deposition method.

In the vapor deposition method, one or more gases are used as a material for forming thin layers. Examples of the vapor deposition methods include various methods, such as chemical vapor deposition (CVD) and/or atomic layer deposition (ALD).

Among display apparatuses, organic light-emitting display apparatuses have wide viewing angles, excellent contrast, and fast response speeds. Thus, the organic light-emitting display apparatuses have drawn the attention as next-generation display apparatuses.

An organic light-emitting display apparatus includes a first electrode and a second electrode that face each other, an intermediate layer including an organic emission layer between the first and second electrodes, and one or more various thin layers. In this case, a deposition process may be used to form the thin layers of the organic light-emitting display apparatus.

However, as the organic light-emitting display apparatus has a large size and high resolution, it is not easy to deposit large size thin layers having desired characteristics. In addition, there may be a limitation to improving the efficiency of a process of forming the thin layers.

Information disclosed in this Background section may have already been known to the inventors before achieving the inventive concept, and/or may be technical information acquired in the process of achieving the inventive concept. Therefore, it may contain information that does not constitute prior art.

SUMMARY

One or more aspects of exemplary embodiments relate to a plasma-enhanced chemical vapor deposition device that may prevent or reduce damage to a deposition mask otherwise caused by an arcing phenomenon and deposition defects, and a method of manufacturing a display apparatus by using the plasma-enhanced chemical vapor deposition device.

Additional aspects will be set forth in part in the description which follows, and in part, will be apparent from the description, or may be learned by practice of the presented embodiments.

According to one or more exemplary embodiments, a plasma-enhanced chemical vapor deposition device includes: a sprayer configured to spray a gas onto a substrate; a lift configured to support a mask comprising a pattern through which the gas is able to pass, and configured to raise or lower the mask; and a susceptor configured to support the substrate for depositing the gas, and configured to raise or lower the substrate, wherein the susceptor includes a first ground configured to electrically contact the mask during a deposition process during which the gas is deposited on the substrate.

The plasma-enhanced chemical vapor deposition device may further include a second ground configured to be electrically connected to the susceptor, and configured to discharge charges of the susceptor to the outside using the first ground.

At least one of the lift and the susceptor may be configured to linearly move with respect to each other.

The plasma-enhanced chemical vapor deposition device may further include a support pin configured to support the substrate, and configured to raise or lower the substrate, wherein the susceptor may include a support pin through hole through which the support pin passes.

The susceptor may include a lift through hole through which the lift passes.

The lift may be configured to move in a first direction that is an ascending/descending direction of the lift with respect to the susceptor, and may be configured to move in at least one of a second direction that crosses the first direction or a third direction that crosses the second direction.

The lift may include a plurality of lifts, and a pair of the plurality of lifts may be configured to move in a first direction that is an ascending/descending direction of the lift with respect to the susceptor, and may be configured to move in at least one of a second direction that crosses the first direction or a third direction that crosses the first and second directions.

Another pair of the plurality of lifts may be configured to move in the first direction.

The plasma-enhanced chemical vapor deposition device may further include a second ground configured to be electrically connected to the susceptor to discharge charges provided to the susceptor from the mask to the outside using the first ground.

The first ground may include a conductive material.

The first ground may include a ceramic and a conductive material, and the conductive material may be configured to electrically contact the mask.

The susceptor may further include an installation groove in which the first ground is installed.

The susceptor may further include an elastic body configured to be in the installation groove, and configured to allow the first ground to be elastically moved in an ascending/descending direction of the susceptor.

According to one or more exemplary embodiments, a method of manufacturing a display apparatus includes: loading a substrate into a chamber including a plasma region; supplying a gas into the chamber; forming a radical in the chamber when the gas passes through the plasma region; and forming a deposition layer on the substrate when the radical reacts on the substrate while a mask electrically contacts a first ground.

The deposition layer may include an insulating layer.

The method may further include aligning the substrate and the mask with each other.

The method may further include: moving the mask in a first direction; and moving the mask in at least one of a second direction that crosses the first direction, or a third direction that crosses the first and second directions, to align the substrate and the mask.

The forming of the deposition layer on the substrate may include contacting the substrate to the mask.

When the substrate and the mask contact each other, one end of a lift may contact one surface of the mask that contacts the substrate.

One end of a lift that contacts the mask and one end of the first ground that contacts the mask may be positioned at corresponding heights.

The above described embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
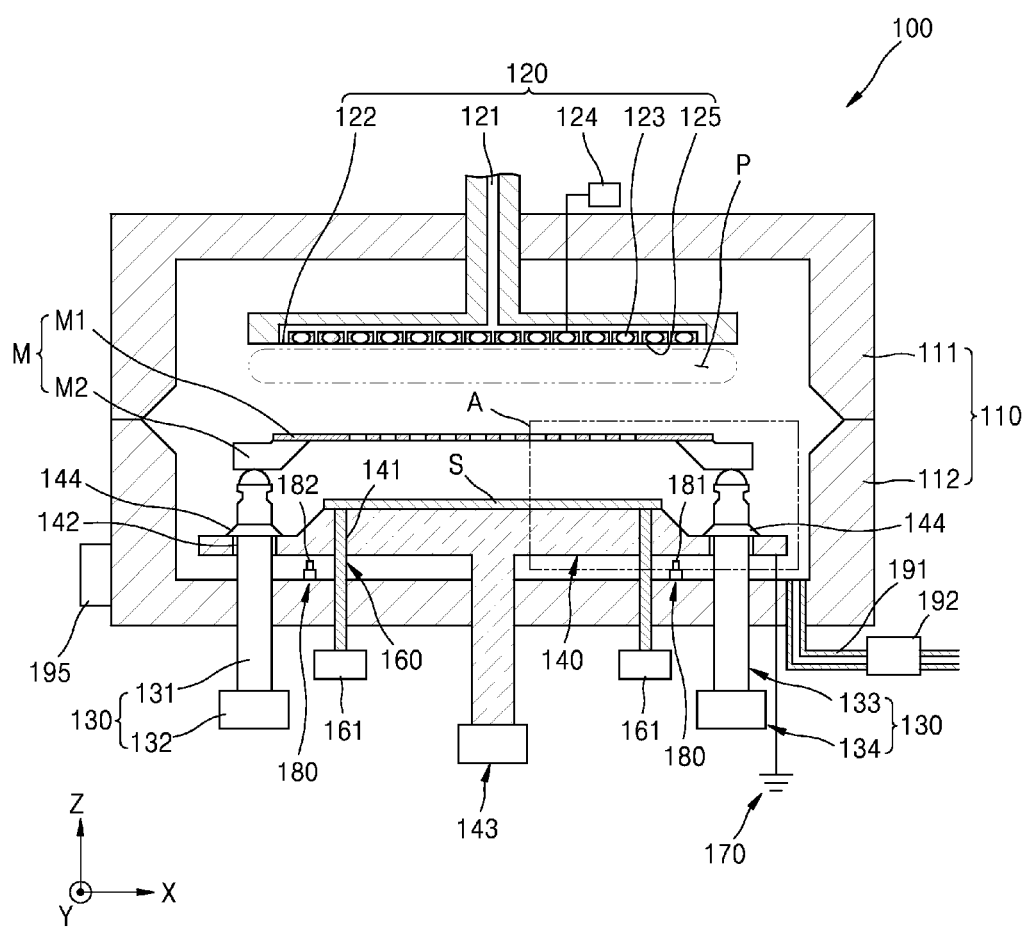
FIG. 1 is a conceptual diagram schematically illustrating a plasma-enhanced chemical vapor deposition device according to an exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a conceptual diagram schematically illustrating a plasma-enhanced chemical vapor deposition device 100 according to an exemplary embodiment.

Referring to FIG. 1, the plasma-enhanced vapor deposition device 100 may include a chamber 110 having a space therein. The chamber 110 may be maintained or substantially maintained in a vacuum or atmospheric state according to a degree of a process. In more detail, the chamber 110 may be maintained or substantially maintained in a vacuum state while deposition is performed, and may be maintained or substantially maintained in an atmospheric state when a substrate S is inserted into and/or unloaded from the chamber 110.

The chamber 110 may include a first housing 111, and a second housing 112 coupled to the first housing 111. The first housing 111 and the second housing 112 may be coupled to each other using, for example, a bolt, a screw, a clamp, a flange, and/or a ring. An opening, through which the substrate S is inserted into and/or unloaded from the chamber 110, may be defined by at least one of the first housing 111 and the second housing 112. In addition, the chamber 110 may include a door that opens/closes the opening. In addition, the substrate S may be inserted into and/or unloaded from the chamber 110 after the first housing 111 and the second housing 112 are separated from each other. However, hereinafter, for convenience of explanation, a case in which the substrate S is inserted into and/or unloaded from the chamber 110 through the opening will be described in more detail.

The plasma-enhanced chemical vapor deposition device 100 may include a spray unit (e.g., a sprayer) 120 that supplies a first gas and a second gas into the chamber 110. A portion of the spray unit 120 may be fixed to pass through the chamber 110. A gas flow unit (e.g., a gas flower or a gas flow part) 121, through which the first gas and the second gas flow, may be formed in the spray unit 120. The gas flow unit 121 may be formed to pass through the inside of the spray unit 120, and may be connected to an external gas supply unit (e.g., an external gas supply).

In addition, the spray unit 120 may include a gas injection unit (e.g., a gas injector) 122 that is connected to the gas flow unit 121, and that is formed on a surface of the spray unit 120. The gas injection unit 122 may spray the first gas or the second gas provided through the gas flow unit 121 into the chamber 110. A plurality of gas injection units (e.g., a plurality of gas injectors) 122 may be provided. The plurality of gas injection units 122 may be spaced apart from each other by a distance (e.g., predetermined distance).

The spray unit 120 may form a plasma region P, and may include a coil unit (e.g., a coil or coil part) 123 and a power supply unit (e.g., a power supply or a power supply source) 124 to form plasma using the first gas. In more detail, the coil unit 123 may be located at a bottom portion of the spray unit 120, and may be connected to the power supply unit 124. In this case, the power supply unit 124 may apply power (e.g., radio frequency (RF) power) to the coil unit 123, and the coil unit 123, which may be a kind of induction coil, may change the first gas to be in a plasma state.

In more detail, the coil unit 123 may generate plasma using the first gas supplied through the gas injection units 122, and then may excite the second gas supplied through the gas injection units 122 through the generated plasma to be in a plasma state. For example, the coil unit 123 may excite the second gas supplied through the gas injection units 122 to be in a plasma state. Hereinafter, for convenience of explanation, a case in which plasma is generated using the first gas, and in which the second gas is then excited to be in the plasma state using the generated plasma will be described in more detail.

Furthermore, the spray unit 120 may include a cover unit (e.g., a cover or a cover part) 125 installed on the coil unit 123. In this case, the cover unit 125 may include an insulating material, and may prevent or reduce damage to the coil unit 123 by the plasma. The cover unit 125 may be formed to not overlap the gas injection units 122. That is, the gas injection units 122 may be formed to pass through the cover unit 125.

The plasma-enhanced chemical vapor deposition device 100 may include a lifting unit (e.g., a lifter) 130 that aligns a mask unit (e.g., a mask) M with the substrate S, and moves the mask unit M optionally. The lifting unit 130 may include at least one lift, for example, first and second lifts 131 and 133, and at least one lift driving unit (e.g., lift driver), for example, first and second lift driving units 132 and 134. The lift driving units 132 and 134 may respectively drive the first and second lifts 131 and 133. The lifting unit 130 will be described in more detail with reference to FIGS. 2 and 3.

The plasma-enhanced chemical vapor deposition device 100 may further include a susceptor 140 that is configured to raise and lower the substrate S. The substrate S may be arranged (e.g., seated or placed) on the susceptor 140, and when the deposition process is performed, the susceptor 140 may support the substrate S. Also, a heater may be installed on the susceptor 140 to adjust a temperature of the substrate S.

The susceptor 140 may include support pin through holes 141 into which support pins 160 are inserted, and lift through holes 142 into which the lifting unit 130 is inserted. In addition, a fixing unit (e.g., a fixer or fixing part) may be installed on the susceptor 140 to fix the substrate S after the substrate S is mounted thereon. The fixing unit may be of various kinds, such as a clamp, a pressing unit, and/or an adhesive material.

In addition, the plasma-enhanced chemical vapor deposition device 100 may include a susceptor driving unit (e.g., a susceptor driver) 143 that is connected to the susceptor 140 to raise/lower the susceptor 140. In this case, the susceptor driving unit 143 may include a motor and a gear unit (e.g., a gear or gear part) connected to the motor, and a cylinder, the length of which may change. However, the susceptor driving unit 143 is not limited thereto, and may include any suitable devices and structures that may raise/lower the susceptor 140. Hereinafter, for convenience of explanation, a case that the susceptor driving unit 143 includes a cylinder will be described in more detail.

The susceptor 140 may include a first ground unit (e.g., a first ground) 144 that is electrically connected to (e.g., electrically contacts) the mask unit M when a deposition process of depositing a gas onto the substrate S is performed. The first ground unit 144 may contact the mask unit M during the deposition process, and may serve as a path in which charges accumulated on the mask unit M during the deposition process are discharged to the outside via a main body of the susceptor 140. The first ground unit 144 will be described in more detail with reference to FIGS. 3 and 4.

The support pins 160 that support and raise/lower the substrate S may include a plurality of support pins 160. The plurality of support pins 160 may be spaced apart from each other by a distance (e.g., a predetermined distance), and may stably support and raise/lower the substrate S.

In addition, the plasma-enhanced chemical vapor deposition device 100 may further include a support pin driving unit (e.g., a support pin driver) 161 that supports and raises/lowers the support pins 160. The structure of the support pin driving unit 161 may be the same or substantially the same as the structure of the susceptor driving unit 143, and thus, a further detailed description thereof will be omitted.

The plasma-enhanced chemical vapor deposition device 100 may further include a second ground unit (e.g., a second ground) 170 that is electrically connected to the susceptor 140, and is able to discharge the charges provided to the susceptor 140 to the outside using the first ground unit 144. In this way, due to a structural feature of the plasma-enhanced chemical vapor deposition device 100 including the first ground unit 144 and the second ground unit 170 that are electrically connected to the mask unit M and the outside, the charges accumulated on the mask unit M during the deposition process may be discharged to the outside.

In more detail, the plasma-enhanced chemical vapor deposition device 100 according to one or more exemplary embodiments of the present invention performs a deposition process using plasma, as described above, and thus, a large amount of charges may be generated during the deposition process. These charges may be accumulated on the mask unit M during the deposition process, and due to the accumulated charges, there may be a risk of causing an arcing phenomenon at a region in which the mask unit M and the substrate S contact each other.

When the arcing phenomenon occurs at the region in which the mask unit M and the substrate S contact each other, at least one of the mask unit M and the substrate S may be melted and/or be damaged. Furthermore, the deposition process may not be normally performed, and thus, deposition defects may occur. In addition, to increase a deposition process speed of the plasma-enhanced chemical vapor deposition device 100, and to improve the quality of thin layers to be deposited, it may be desirable to increase the power of RF plasma. However, when power of high-frequency plasma is increased, the risk of causing the arcing phenomenon also increases.

Accordingly, the plasma-enhanced chemical vapor deposition device 100 according to one or more exemplary embodiments of the present invention provides a structure in which the plasma-enhanced chemical vapor deposition device 100 includes the first ground unit 144 and the second ground unit 170 to discharge the charges accumulated on the mask unit M during the deposition process to the outside of the chamber 110. Thus, the arcing phenomenon may be reduced, and thus, the deposition process speed may increase. Furthermore, the quality of thin layers to be deposited may be improved, and a period for replacing a damaged mask unit M may also be extended.

The plasma-enhanced chemical vapor deposition device 100 may further include an alignment unit (e.g., an aligner) 180 that calculates and aligns positions of the mask unit M and the substrate S. The alignment unit 180 may include a camera that captures an image of a first alignment mark of the mask unit M, and captures an image of a second alignment mark of the substrate S. In more detail, the alignment unit 180 may include a first camera 181, a second camera 182, a third camera, and a fourth camera. However, the alignment unit 180 is not limited thereto, and may include any suitable devices that can monitor the positions of the mask unit M and the substrate S.

As described above, the mask unit M and the substrate S may be aligned with each other based on the position of the first alignment mark of the mask unit M and the position of the second alignment mark of the substrate S. In particular, a method of determining the position of the mask unit M and the position of the substrate S using the alignment unit 180 may be the same or substantially the same as a method of determining the position of the mask unit M and the position of the substrate S using a general camera as would be known to those having ordinary skill in the art, and thus, a detailed description thereof will be omitted.

In addition, the plasma-enhanced chemical vapor deposition device 100 may include an exhaust pipe 191 connected to the chamber 110, and an exhaust pump 192 installed on the exhaust pipe 191. In this case, the exhaust pump 192 may maintain or substantially maintain the inside of the chamber 110 in a vacuum state. In addition, the exhaust pump 191 may discharge unnecessary gases generated during a vapor deposition process to the outside of the chamber 110.

The plasma-enhanced chemical vapor deposition device 100 may further include a controller 195 that controls a temperature of at least one of the lifting unit 130 and the susceptor 140. In this case, the controller 195 may include various forms. For example, the controller 195 may include various electronic devices, such as a personal computer (PC), a notebook, a general control circuit, and/or a portable electronic device. However, the controller 195 is not limited thereto, and may include any suitable device that can control the plasma-enhanced chemical vapor deposition device 100.

Hereinafter, the lifting unit 130 will be described in more detail with reference to FIG. 2.

Figure 2:
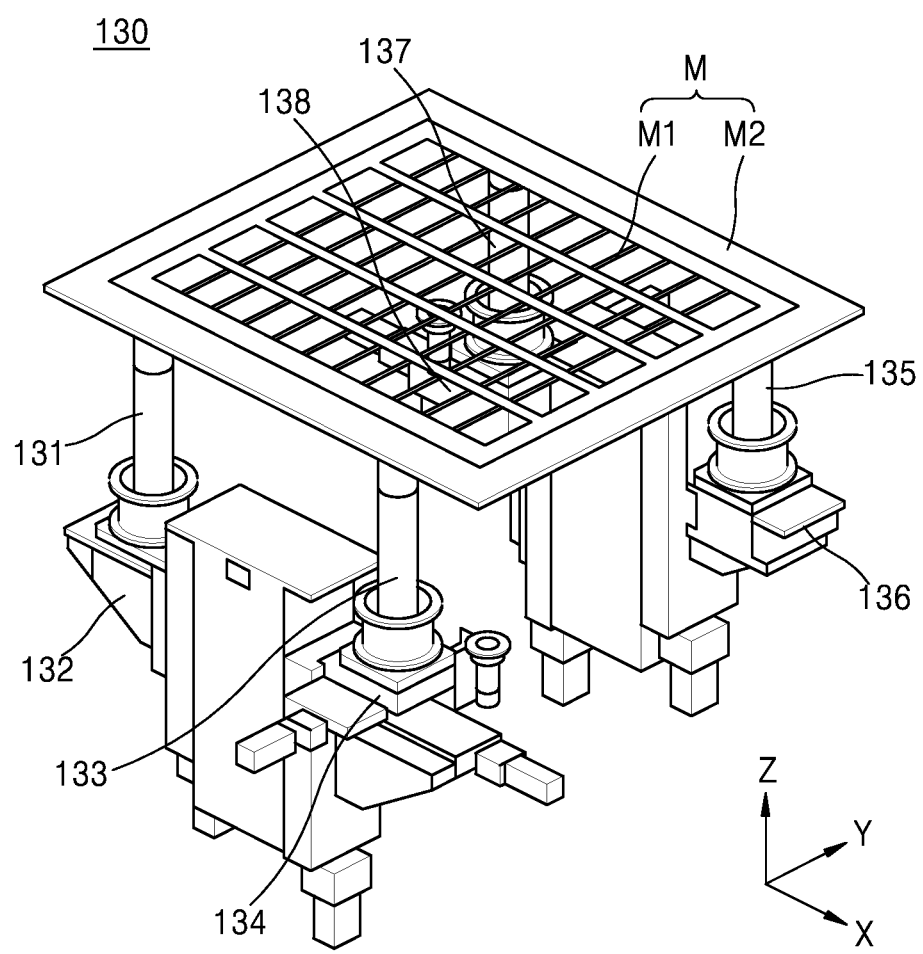
FIG. 2 is a perspective view illustrating a lifting unit of the plasma-enhanced chemical vapor deposition device illustrated in FIG. 1.

FIG. 2 is a perspective view illustrating a lifting unit (e.g., a lifter) 130 of the plasma-enhanced chemical vapor deposition device 100 illustrated in FIG. 1.

Referring to FIG. 2, the lifting unit 130 may include at least one lift, and at least one lift driving unit (e.g., lift driver) that moves the at least one lift. Hereinafter, for convenience of explanation, an embodiment including four lifts and four lift driving units will be described in detail.

The lifting unit 130 may include a first lift 131, a second lift 133, a third lift 135, and a fourth lift 137. In addition, the lifting unit 130 may include a first lift driving unit 132 that drives the first lift 131, a second lift driving unit 134 that drives the second lift 133, a third lift driving unit 136 that drives the third lift 135, and a fourth lift driving unit 138 that drives the fourth lift 137.

The first to fourth lift driving units 132, 134, 136, and 138 may each operate in the same or substantially the same manner. For example, the first to fourth lift driving units 132, 134, 136, and 138 may form pairs, and may respectively drive the first to fourth lifts 131, 133, 135, and 137.

In more detail, the first lift driving unit 132 and the third lift driving unit 136 may move the first lift 131 and the third lift 135, respectively, in a first direction (e.g., a vertical direction). Here, the first direction may be a z-axis direction of FIG. 2.

In addition, the second lift driving unit 134 and the fourth lift driving unit 138 may move the second lift 133 and the fourth lift 137, respectively, in the first direction, and in at least one of a second direction and a third direction. In this case, the first direction and the second direction may cross each other, and the third direction may cross the first direction and the second direction. In more detail, in FIG. 2, the first direction may be a z-axis direction, the second direction may be an x-axis direction, and the third direction may be a y-axis direction. Here, the first to third directions are only exemplary, and other suitable directions may be used.

The first to fourth lifts 131, 133, 135, and 137 may be formed in the same or substantially the same manner. For example, the first lift 131 and the third lift 135 may be formed in the same manner, and the second lift 133 and the fourth lift 137 may be formed in the same manner.

An operation of the lifting unit 130 configured as described above will be described in more detail. First, the lifting unit 130 may support and may raise/lower the mask unit M. In this case, the mask unit M may include a mask slit M1 in which patterns are formed, and a fixing frame M2 that supports the mask slit M1.

The mask unit M may be inserted into the chamber 110 from the outside, and may be arranged (e.g., seated or placed) on the lifting unit 130. For example, the mask unit M may be arranged (e.g., seated or placed) on the lifting unit 130 using a robot arm installed inside or outside the chamber 110.

The mask unit M arranged on the lifting unit 130 may be aligned with the substrate S during the deposition process. For example, the position of the mask unit M with respect to the substrate S may be aligned by moving at least one of the first to fourth lifts 131, 133, 135, or 137.

In more detail, the first to fourth lifts 131, 133, 135, and 137 may be moved in the first direction to adjust the height of the mask unit M. In addition, the second lift 133 and the fourth lift 137 may be moved in at least one of the second direction and the third direction, so that the mask unit M may be rotated with respect to a plane formed by the substrate S (e.g., an X-Y plane in FIG. 2) and/or the position of the mask unit M may be changed.

In this case, one end that contacts the mask unit M of each of the first to fourth lifts 131, 133, 135, and 137 may be formed as a ball that may be rotated with respect to the mask unit M. Here, the ball formed at the one end of each of the first to fourth lifts 131, 133, 135, and 137 may include an abrasion-resistant material, such as ceramic.

By using the first to fourth lifts 131, 133, 135, and 137 having the one end configured to have a shape of a ball that may be rotated with respect to the mask unit M, the position of the mask unit M may be freely changed on the plane formed by the substrate S, so that alignment between the mask unit M and the substrate S may be performed. In addition, the ball formed at the one end of each of the first to fourth lifts 131, 133, 135, and 137 may be prevented from being rotated, so that the mask unit M may secured on the lifting unit 130.

When the position of the mask unit M is changed in addition to the above-described operations, the lifting unit 130 may perform the above-described operations repeatedly, so that the position of the mask unit M and the position of the substrate S may be aligned with each other.

Hereinafter, the susceptor 140 and the first ground unit 144 will be described in detail with reference to FIG. 3.

Figure 3:
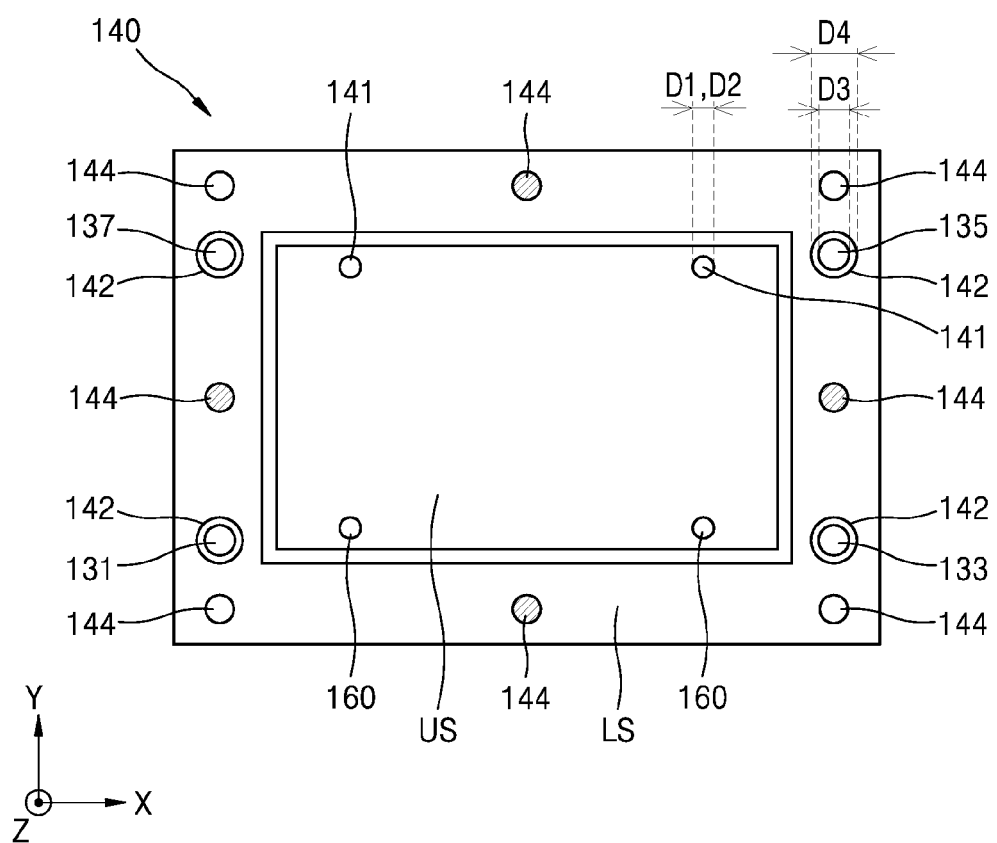
FIG. 3 is a plan view illustrating an upper side of a portion of the plasma-enhanced chemical vapor deposition device of FIG. 1.

FIG. 3 is a plan view illustrating an upper side of a portion of the plasma-enhanced chemical vapor deposition device 100 of FIG. 1.

Referring to FIG. 3, the susceptor 140 may be divided into a first region US that contacts the substrate S, and a second region LS that contacts the mask unit M. The support pin through holes 141, through which the support pins 160 for supporting and for raising/lowering the substrate S may pass, may be formed in the first region US of the susceptor 140, and the lift through holes 142, through which the first to fourth lifts 131, 133, 135, and 137 for supporting and raising/lowering the mask unit M may respectively pass, may be formed in the second region LS of the susceptor 140.

Here, a diameter D1 of each of the support pin through holes 141 may correspond to a diameter D2 of each of the support pins 160, and a diameter D4 of each of the lift through holes 142 may be greater than a diameter D3 of each of the first to fourth lifts 131, 133, 135, and 137. Through this structure, the support pin through holes 141 and the lift through holes 142 are formed, so that alignment between the substrate S and the mask unit M may be performed.

In more detail, the support pins 160 are formed to correspond to the sizes of the support pin through holes 141, and may be fixed so as to not be moved in the x-axis direction and the y-axis direction through the support pin through holes 141, whereas the lift through holes 142 are formed to be larger than the sizes of the first to fourth lifts 131, 133, 135, and 137, and may allow a degree of freedom at which the first to fourth lifts 131, 133, 135, and 137 may move in the x-axis and y-axis directions within the lift through holes 142.

Thus, when the substrate S and the mask unit M are aligned with each other, the first to fourth lifts 131, 133, 135, and 137 are freely moved in the x-axis and/or y-axis directions, so that the mask unit M supported by the first to fourth lifts 131, 133, 135, and 137 may freely move in the x-axis and y-axis directions, and thus, the position of the mask unit M with respect to the substrate S may be freely adjusted.

However, the present invention is not limited to the above configuration. For example, the diameter D1 of each of the support pin through holes 141, instead of the lift through holes 142, may be greater than the diameter D2 of each support pin 160, so that the support pins 160 may freely move in the x-axis and y-axis directions. That is, at least one of the support pin through holes 141 and the lift through holes 142 are formed to have a larger diameter than that of each of the support pins 160, or that of each of the first to fourth lifts 131, 133, 135, and 137, respectively, so that alignment between the substrate S and the mask unit M may be easily performed.

The susceptor 140 may include the first ground unit 144 that electrically couples (e.g., electrically contacts) the mask unit M during the deposition process, as described above. The first ground unit 144 may be formed in the second region LS of the susceptor 140. In the drawings, one first ground unit 144 is installed at each side (e.g., top, bottom, left, and right sides in a plan view) of the susceptor 140. However, the present invention is not limited thereto. For example, at least one first ground unit 144 may be formed in the second region LS of the susceptor 140.

In more detail, the first ground unit 144 is an element for providing the charges accumulated on the mask unit M during the deposition process to the susceptor 140, and for discharging the charges to the outside. Thus, the first ground unit 144 may include a conductive material. For example, a portion of the first ground unit 144 may include a ceramic material, and another portion of the first ground unit 144 may include a conductive material, such as aluminum (Al) and/or steel use stainless (SUS). Here, the other portion of the first ground unit 144 including the conductive material may be exposed in a direction of the mask unit M, and may be electrically connected to (e.g., may electrically contact) the mask unit M.

Thus, the number of first ground units 144 formed in the second region LS of the susceptor 140 may be selected in various ways, so that the first ground unit 144 provides the charges, which are accumulated on the mask unit M during the deposition process, to the main body of the susceptor 140, and discharges the charges to the outside.

Next, various examples of the first ground unit 144 according to one or more exemplary embodiments of the present invention will be described in more detail with reference to FIGS. 4 and 5.

Figure 4:
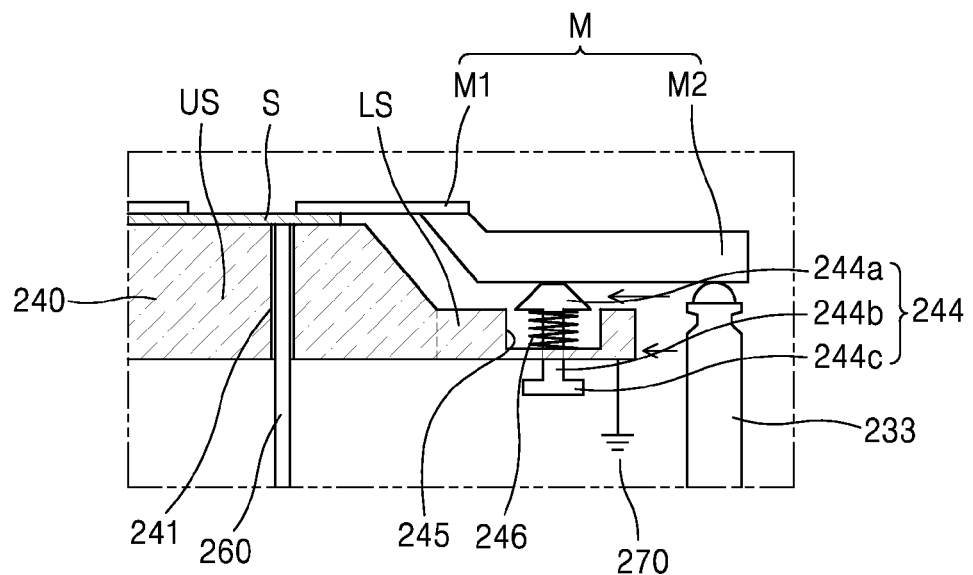
FIG. 4 is a cross-sectional view illustrating another exemplary embodiment of a susceptor shown in FIG. 3.
Figure 5:
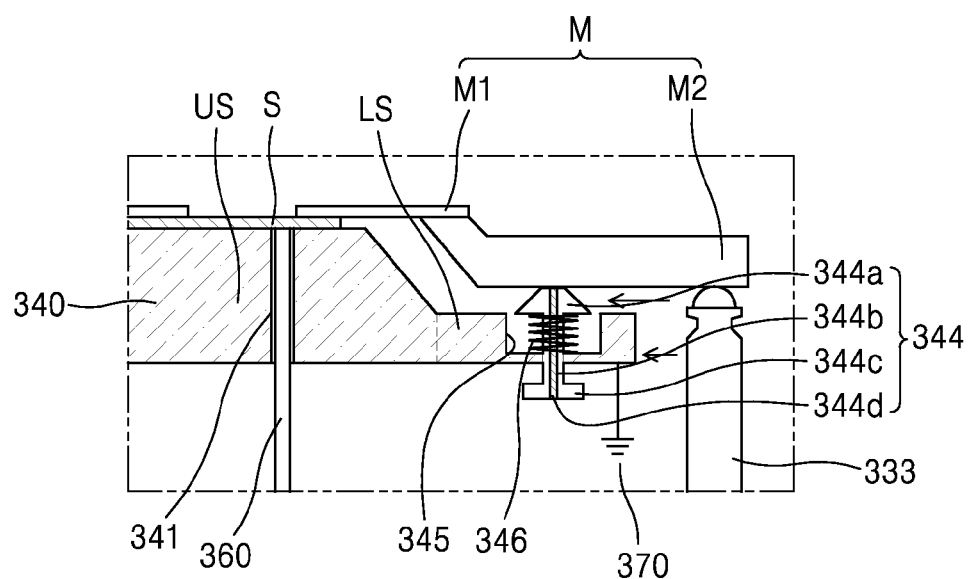
FIG. 5 is a cross-sectional view illustrating another exemplary embodiment of a susceptor shown in FIG. 3.

FIG. 4 is a cross-sectional view illustrating another embodiment of a susceptor shown in FIG. 3, and FIG. 5 is a cross-sectional view illustrating another embodiment of a susceptor shown in FIG. 3.

First, referring to FIG. 4, a susceptor 240 may further include an installation groove 245 in which a first ground unit (e.g., a first ground) 244 is installed. The installation groove 245 may be formed in a second region LS of the susceptor 240 that is connected to (e.g., contacts) the mask unit M, and may include a recess from one surface of the mask unit M that faces a fixing frame M2 in the second region LS of the susceptor 240. The first ground unit 244 may be inserted into the installation groove 245.

Here, the first ground unit 244 is an element for providing charges accumulated on the mask unit M during the deposition process to the susceptor 140, like the first ground unit 144 illustrated in FIG. 3, and for discharging the charges to the outside. Thus, the first ground unit 244 may include a conductive material. The first ground unit 244 may be exposed in a direction of the mask unit M, and may be electrically connected to (e.g., may electrically contact) the mask unit M.

Thus, the first ground unit 244 including the conductive material may be electrically connected to (e.g., may electrically contact) the mask unit M, may provide the charges accumulated on the mask unit M to the susceptor 240, and may discharge the charges provided to the susceptor 240 to the outside using a second ground unit (e.g., a second ground) 270 that is electrically connected to the susceptor 240.

In the present embodiment, the first ground unit 244 may include a head 244a that directly contacts the fixing frame M2 of the mask unit M, a body 244b formed to pass through the installation groove 245 to ascend/descend in the installation groove 245, and a stopper 244c that is formed below the susceptor 240 and that prevents separation of the first ground unit 244 from the susceptor 240.

In addition, the susceptor 240 may further include an elastic body (e.g., a spring) 246 installed in the installation groove 245, so that the first ground unit 244 may elastically move in a raising/lowering direction of the susceptor 240. For example, the elastic body 246 may include a spring having an elastic force (e.g., a predetermined elastic force) that surrounds the body 244b of the first ground unit 244, and the spring may be inserted and installed between the head 244a of the first ground unit 244 and a top surface of (and/or partially within) the installation groove 245, as illustrated in FIG. 4.

Here, the first ground unit 244 may move in the raising/lowering direction of the susceptor 240, and when the mask unit M descends and contacts the first ground unit 244, the first ground unit 244 may descend together with the mask unit M. Further, when the mask unit M ascends and is separated from the first ground unit 244, the first ground unit 244 may ascend together with the mask unit M. However, the configuration of the installation groove 245 and the first ground unit 244 including the elastic body 246 is only an example, and any suitable configuration in which the first ground unit 244 descends/ascends with the mask unit M as described above may be formed.

Referring to FIG. 5, a first ground unit (e.g., a first ground) 344 according to another embodiment of the present invention may include a conductive region 344d including a conductive material, a head 344a surrounding the conductive region 344d, a body 344b, and a stopper 344c. Here, the remaining parts of the first ground unit 344 (e.g., the head 344a, the body 344b, and the stopper 344c), other than the conductive region 344d, may include ceramic that is a non-conductor. Here, the conductive region 344d including the conductive material may be electrically connected to (e.g., may electrically contact) the mask unit M, may provide charges accumulated on the mask unit M to a susceptor 340, and may discharge the charges provided to the susceptor 340 to the outside using a second ground unit (e.g., a second ground) 370 that is electrically connected to the susceptor 340.

Unlike the susceptors 140 shown in FIGS. 1 and 3, the susceptors 240 and 340 respectively shown in FIGS. 4 and 5, according to some exemplary embodiments of the present invention, might not include the structure of the lift through holes 142 illustrated in FIGS. 1 and 3. That is, the susceptors 240 and 340 illustrated in FIGS. 4 and 5 may include only the support pin through holes 241 and 341, through which support pins 260 and 360 are inserted into the susceptors 240 and 340, respectively, to ascend/descend, so that the support pins 260 and 360 may support and raise/lower the substrate S.

Figure 6:
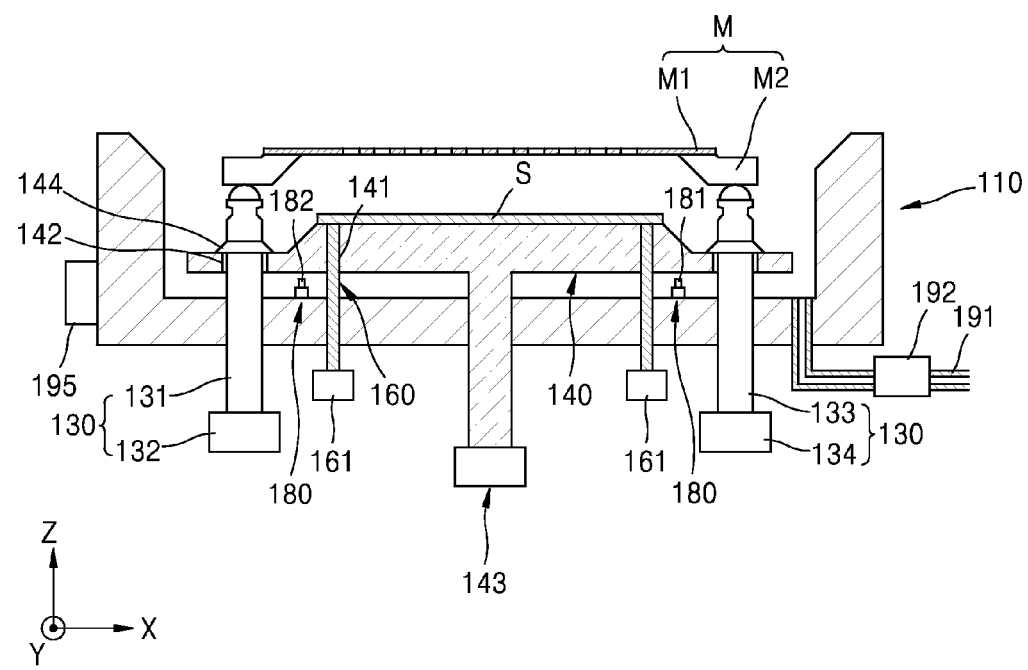
FIG. 6 is a diagram illustrating a first operation of the plasma-enhanced chemical vapor deposition device of FIG. 1.

FIG. 6 is a diagram illustrating a first operation of the plasma-enhanced chemical vapor deposition device 100 illustrated in FIG. 1.

Referring to FIG. 6, when the plasma-enhanced chemical vapor deposition device 100 operates, the lifting unit 130 may lift the mask unit M to an upper side (e.g., an uppermost side) of the chamber 110. In addition, the susceptor 140 may be arranged at a lower side (e.g., a lowermost side) of the chamber 110.

When the lifting unit 130 and the susceptor 140 are arranged as described above, the substrate S may be inserted into the chamber 110. In this case, the substrate S may be moved into the chamber 110 from the outside using, for example, a robot arm as described above, and may be supported by the support pins 160. In the present embodiment, a susceptor driving unit (e.g., a susceptor driver) 143 or a support pin driving unit (e.g., a support pin driver) 161 may operate to adjust the height of the susceptor 140 or of the substrate S, respectively, so that the substrate S may be in close contact with the susceptor 140.

When the substrate S is arranged (e.g., seated or placed) on the susceptor 140, as described above, the mask unit M and the substrate S may be spaced apart from each other. In this case, a space (e.g., a predetermined space) may be formed between the substrate S and the mask unit M.

Figure 7:
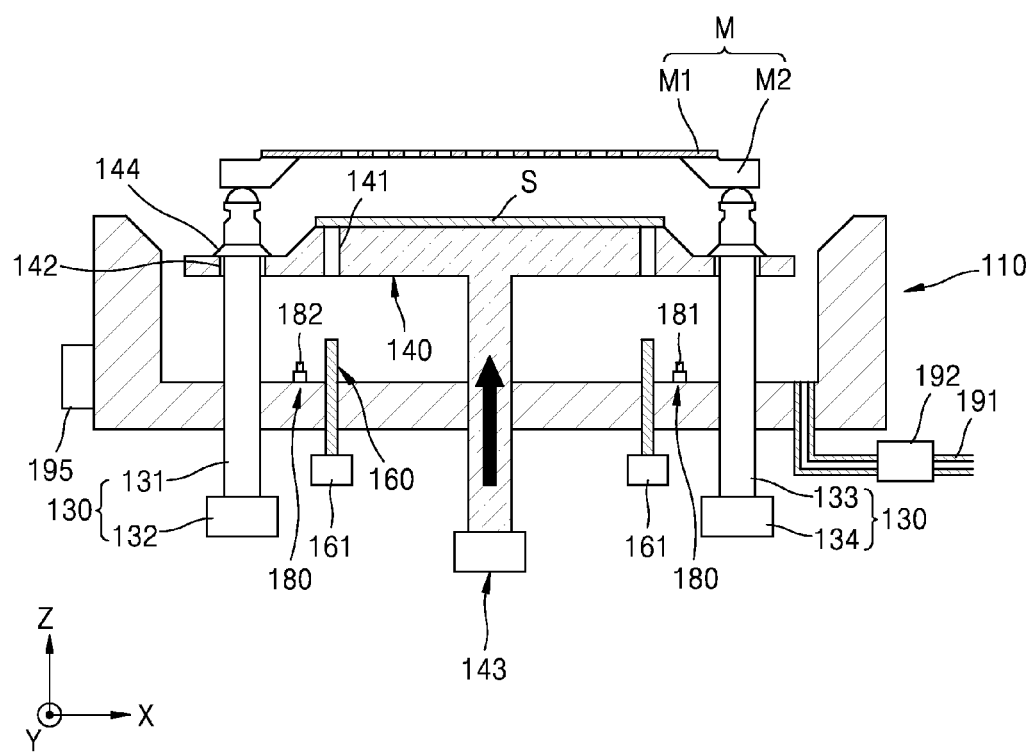
FIG. 7 is a diagram illustrating a second operation of the plasma-enhanced chemical vapor deposition device of FIG. 1.

FIG. 7 is a diagram illustrating a second operation of the plasma-enhanced chemical vapor deposition device 100 of FIG. 1.

Referring to FIG. 7, after insertion of the substrate S is completed, as described above, the susceptor 140 may raise a distance (e.g., a predetermined distance), so that a distance between the mask unit M and the substrate S may be narrowed. In this case, the susceptor 140 may be raised so that the distance between the substrate S and the mask unit M may be narrowed further than that shown in FIG. 7. The controller 195 may control the susceptor driving unit 143 based on a position (e.g., a predetermined position) of the susceptor 140.

Figure 8:
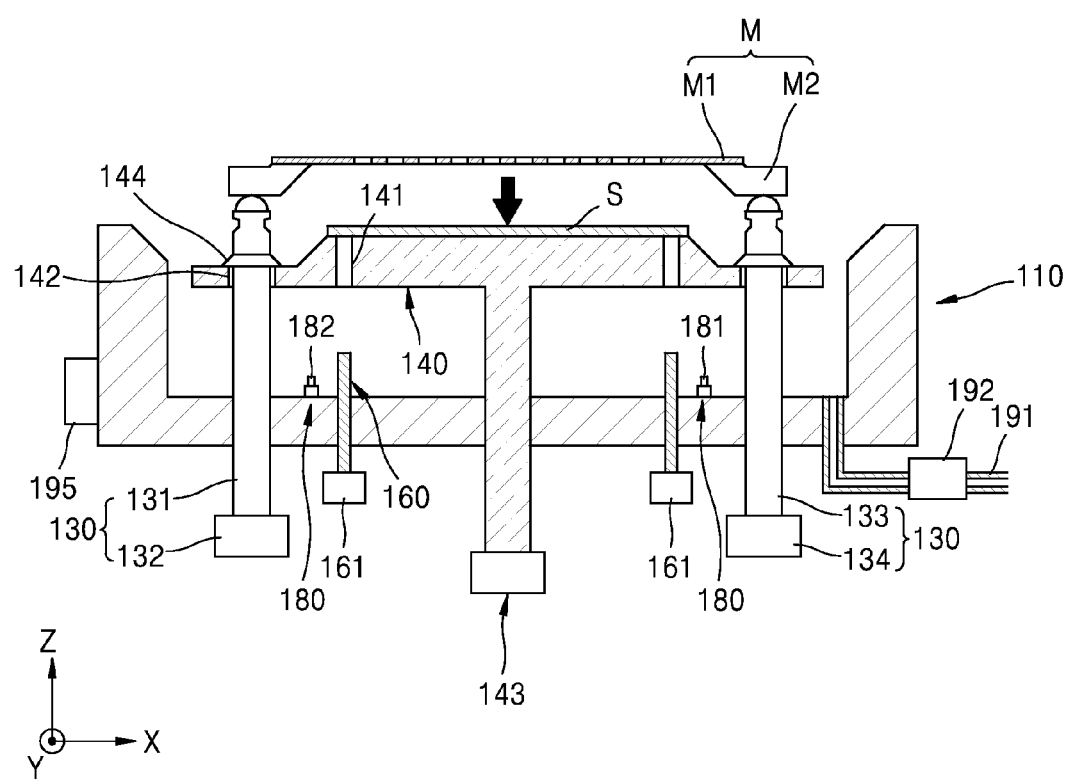
FIG. 8 is a diagram illustrating a third operation of the plasma-enhanced chemical vapor deposition device of FIG. 1.

FIG. 8 is a diagram illustrating a third operation of the plasma-enhanced chemical vapor deposition device 100 of FIG. 1.

Referring to FIG. 8, after the mask unit M and the substrate S are arranged, as described above, the positions of the mask unit M and the substrate S may be aligned with each other. In this case, an alignment method between the mask unit M and the substrate S may include capturing an image of a first alignment mark of the mask unit M and an image of a second alignment mark of the substrate S using the alignment unit 180, and controlling, by the controller 195, the lifting unit 130 to move the mask unit M, so that the first alignment mark of the mask unit M and the second alignment mark of the substrate S may correspond to each other.

In more detail, the alignment unit 180 may capture the image of the first alignment mark of the mask unit M and the image of the second alignment mark of the substrate S, and may transmit the images to the controller 195. Then, the controller 195 may move the mask unit M in at least one of the first direction, the second direction, and the third direction by using the lifting unit 130, when the first alignment mark of the mask unit M and the second alignment mark of the substrate S do not correspond to each other, so that the first alignment mark of the mask unit M and the second alignment mark of the substrate S may correspond to each other. In more detail, as shown in FIG. 8, the first direction may be a z-axis direction, the second direction may be an x-axis direction, and the third direction may be a y-axis direction. Here, the first to third directions are just an example, and various directions may be provided.

In this case, in a method of rotating the mask unit M, the mask unit M may be moved in at least one of the second and third directions, and may be rotated. In addition, when the distance between the mask unit M and the substrate S is larger than a desired distance (e.g., predetermined distance), the mask unit M may be moved in the first direction (e.g., a vertical direction) so that the mask unit M and the substrate S may be spaced apart from each other by the desired distance.

For example, in the above case, the second lift 133 and a fourth lift (e.g., fourth lift 137) may be moved, so that the mask unit M may be moved in at least one of the second direction and the third direction. In addition, when the mask unit M is moved in the first direction, the controller 195 may control a first lift driving unit (e.g., a first lift driver) 132 through a fourth lift driving unit (e.g., a fourth lift driver/driving unit 138), so that the first lift 131 through the fourth lift may be concurrently (e.g., simultaneously) moved.

Figure 9:
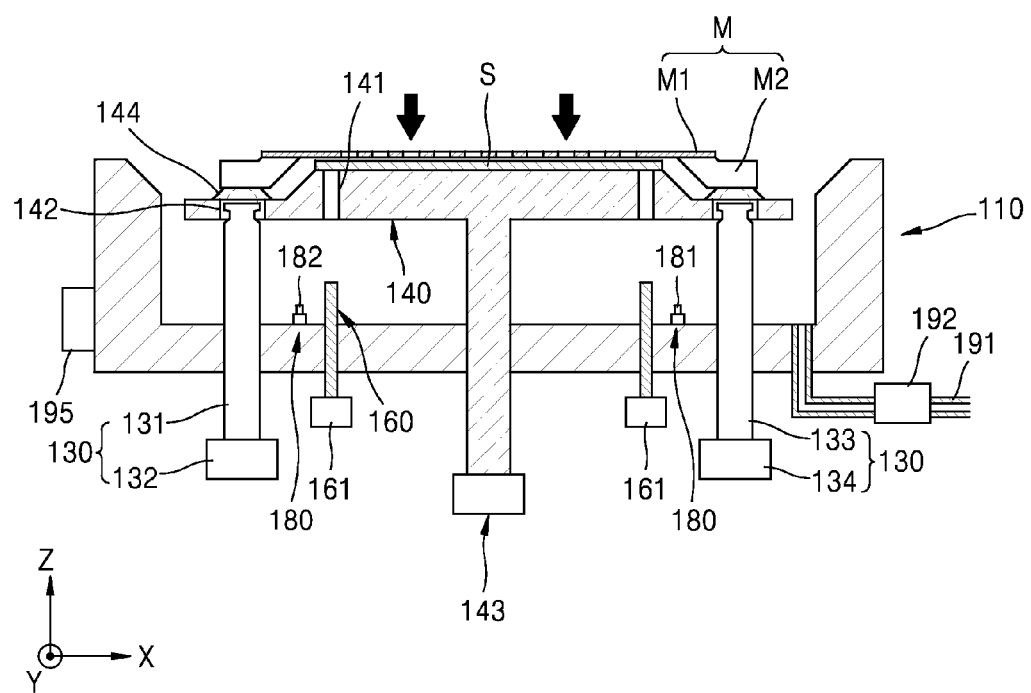
FIG. 9 is a diagram illustrating a fourth operation of the plasma-enhanced chemical vapor deposition device of FIG. 1.

FIG. 9 is a diagram illustrating a fourth operation of the plasma-enhanced chemical vapor deposition device 100 of FIG. 1.

Referring to FIG. 9, after alignment between the mask unit M and the substrate S is completed, as described above, the controller 195 may control the lifting unit 130 to fix the position of the susceptor 140, and to descend the mask unit M. In this case, the substrate S and the mask unit M may be in full contact with each other. In this case, the second region LS of the susceptor 140 is in full contact with a portion of the mask unit M (e.g., the fixing frame M2 through the first ground unit 144), so that the mask unit M and the substrate S may contact each other, and the distance between the mask unit M and the susceptor 140 may be reduced or minimized.

When the lifting unit 130 operates, as described above, the first lift 131 through the fourth lift may be maintained to contact the mask unit M. In more detail, when the lifting unit 130 operates, the first lift 131 through the fourth lift may descend to a position shown in FIG. 8. In this case, the controller 195 may control the first lift driving unit 132 through the fourth lift driving unit, so that the first lift 131 through the fourth lift may descend up to a boundary at which one surface of the susceptor 140 and one surface of the mask unit M contact each other. In particular, a distance at which the first lift 131 through the fourth lift descend may be set by the controller 195.

Figure 10:
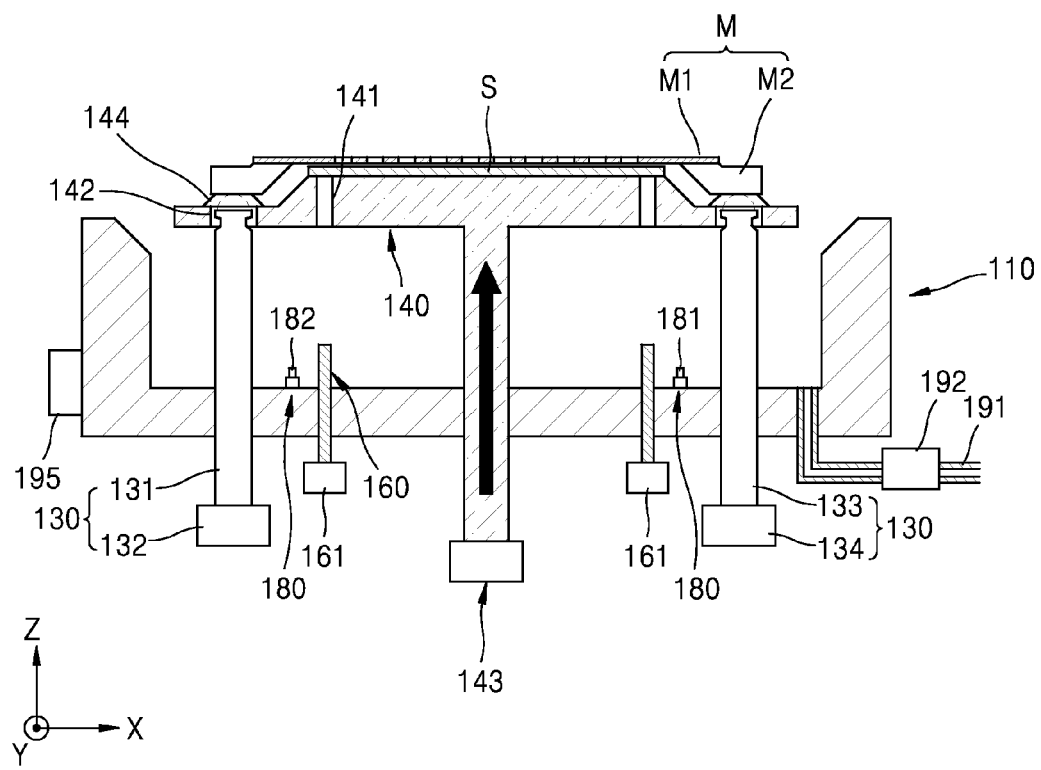
FIG. 10 is a diagram illustrating a fifth operation of the plasma-enhanced chemical vapor deposition device of FIG. 1.

FIG. 10 is a diagram illustrating a fifth operation of the plasma-enhanced chemical vapor deposition device 100 of FIG. 1.

Referring to FIG. 10, after the substrate S and the mask unit M contact each other, the controller 195 may operate the susceptor driving unit 143 to ascend the susceptor 140 to be higher than a position shown in FIG. 9. In this case, the substrate S may ascend together with the susceptor 140, and the mask unit M may ascend together with the substrate S.

While the above task is performed, the controller 195 may control the lifting unit 130 to ascend the mask unit M. In this case, the controller 195 may control the first lift driving unit 132 through the fourth lift driving unit to operate in sync with the susceptor driving unit 143.

In more detail, the controller 195 may calculate a raising/lowering speed of the susceptor 140 to operate the first lift driving unit 132 through the fourth lift driving unit, so that the first lift 131 through the fourth lift may ascend at the same or substantially the same speed as the raising/lowering speed of the susceptor 140.

When the above task is completed, after a first gas is supplied into the chamber 110, plasma may be formed on the periphery of a spray unit (e.g. a sprayer), a second gas may be supplied into the chamber 110 using the spray unit, and a deposition layer may be formed on the substrate S. In this case, the second gas may pass through a region in which plasma is formed, a radical may be formed and the radical may react on the substrate S, and the deposition layer may be formed.

When the above deposition process is completed, the susceptor 140 and the first lift 131 through the fourth lift may descend. In this case, the first lift 131 through the fourth lift may stop at a desired distance (e.g., a predetermined distance), and the susceptor 140 may ascend at a height that is equal to or less than a height at which the first lift 131 through the fourth lift is stopped, so that the substrate S and the mask unit M may be separated from each other. In particular, the susceptor 140 and the first lift 131 through the fourth lift may make a relative motion with respect to each other, so that the mask unit M and the substrate S may be separated from each other.

In addition, the susceptor 140 may descend at a desired distance (e.g., a predetermined distance), the inside of the chamber 110 may be in an atmospheric state, and the substrate S on which the deposition layer is formed may be unloaded from the chamber 110 toward the outside.

Figure 11:
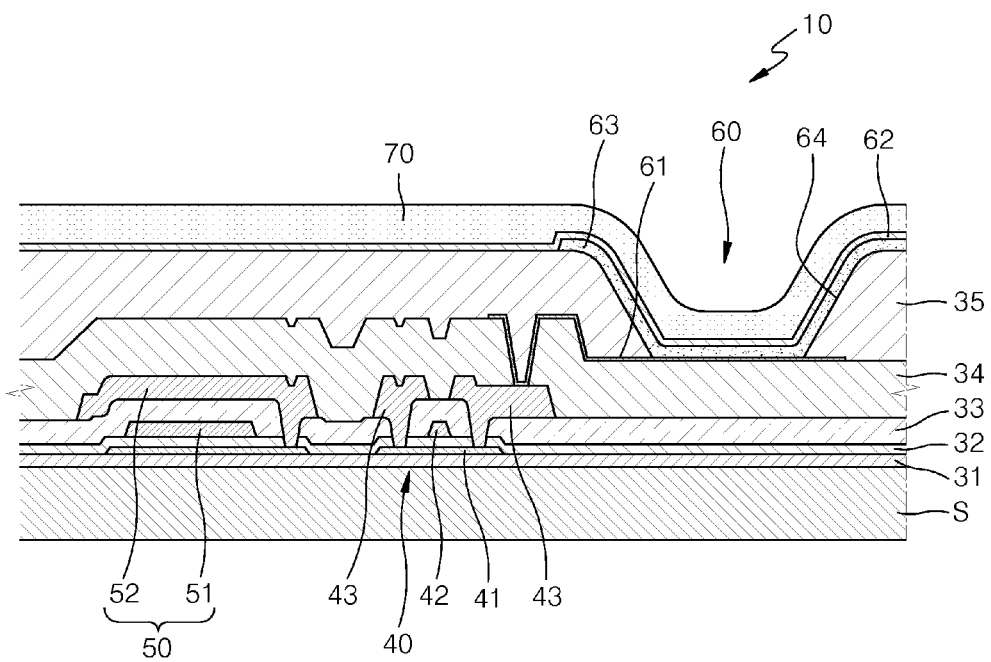
FIG. 11 is a cross-sectional view schematically illustrating a portion of a display apparatus manufactured using the plasma-enhanced chemical vapor deposition device of FIG. 1.

FIG. 11 is a cross-sectional view schematically illustrating a portion of a display apparatus 10 manufactured using the plasma-enhanced chemical vapor deposition device 100 of FIG. 1.

Referring to FIG. 11, the display apparatus 10 that is manufactured using the plasma-enhanced chemical vapor deposition device 100 may be formed in various ways. For example, the display apparatus 10 may include a liquid crystal display (LCD) apparatus, a plasma display apparatus, and/or an organic light-emitting display apparatus. Hereinafter, for convenience of explanation, the display apparatus 10 including the organic light-emitting display apparatus will be described in more detail.

When the organic light-emitting display apparatus 10 is manufactured, the plasma-enhanced chemical vapor deposition device 100 may form a deposition layer on the substrate S. In this case, the deposition layer may include various insulating layers. For example, the deposition layer may include any one of insulating layers, such as a buffer layer 31, a gate insulating layer 32, an interlayer insulating layer 33, a passivation layer 34, and/or a pixel defining layer (PDL) 35 of the organic light-emitting display apparatus 10 that will be described in more detail below.

In addition, the deposition layer may include any one of other various layers, such as an active layer 41, a gate electrode 42, source and drain electrodes 43, a first electrode 61, an intermediate layer 63, and/or a second electrode 62. However, hereinafter, for convenience of explanation, a case that the deposition layer formed using the plasma-enhanced chemical vapor deposition device 100 includes an encapsulation layer 70 will be described in more detail.

The organic light-emitting display apparatus 10 is formed on the substrate S. The substrate S may include a glass material, a plastic material, and/or a metal material. The buffer layer 31 including an insulating material is formed on the substrate S to provide a flat or substantially flat surface on a top portion of the substrate S, and to prevent or substantially prevent moisture and foreign substances from penetrating into the substrate S.

A thin film transistor (TFT) 40, a capacitor 50, and an organic light-emitting diode (OLED) 60 are formed on the buffer layer 31. The TFT 40 includes the active layer 41, the gate electrode 42, and the source and drain electrodes 43. The OLED 60 includes the first electrode 61, the second electrode 62, and the intermediate layer 63.

In more detail, the active layer 41 formed in a pattern (e.g., a predetermined pattern) is located on a top surface of the buffer layer 31. The active layer 41 may include a semiconductor material into which a p-type or n-type dopant is injected. In this case, the active layer 41 including the semiconductor material may include polycrystalline silicon. However, the present invention is not limited thereto, and the active layer 41 may include an oxide semiconductor. For example, the oxide semiconductor may include an oxide selected from a group of a Group 12 element, a Group 13 element, and/or a Group 14 element, such as zinc (Zn), indium (In), gallium (Ga), tin (Sn), cadmium (Cd), germanium (Ge), hafnium (Hf), or a combination thereof. For example, the active layer 41 may include G-I-Z-O[$(In_2O_3)a(Ga_2O_3)b(ZnO)c$] (where a, b, and c are real numbers that satisfy a condition of a≥0, b≥0, and c>0).

The gate insulating layer 32 is formed on the active layer 41. The gate electrode 42 is formed on the gate insulating layer 32 to correspond to (e.g., overlap) the active layer 41. The interlayer insulating layer 33 is formed to cover the gate electrode 42, and the source and drain electrodes 43 are formed on the interlayer insulating layer 33 to contact a region (e.g., a predetermined region) of the active layer 41. The passivation layer 34 is formed to cover the source and drain electrodes 43, and a separate insulating layer may be further formed on the passivation layer 34 to planarize the TFT 40.

The first electrode 61 is formed on the passivation layer 34. The first electrode 61 is formed to be electrically connected to the drain electrode 43. The PDL 35 is formed to cover the first electrode 61. After an opening (e.g., a predetermined opening) 64 is formed in the PDL 35, the intermediate layer 63 including an organic light-emitting layer is formed in a region defined by the opening 64. The second electrode 62 is formed on the intermediate layer 63.

The organic light-emitting layer may be formed in various forms. For example, the organic light-emitting layer may be formed in the opening 64, and may form one unit pixel including a plurality of sub-pixels that emit lights of red, green, and blue colors. In addition, the organic light-emitting layer may be commonly formed on an entire surface of the PDL 35, regardless of a position of a pixel. In this case, the organic light-emitting layer may be formed by vertically stacking layers including emission materials that emit lights of red, green, and blue colors, or by mixing the emission materials that emit lights of red, green, and blue colors. When the organic light-emitting layer may emit light of white, the organic light-emitting layer may be formed by combining emission materials that emit lights of different colors. In this case, the organic light-emitting display apparatus 10 may further include a color conversion layer or a color filter layer that converts/filters the white light into a light of a desired color (e.g., a predetermined color).

The encapsulation layer 70 is formed on the second electrode 62. The encapsulation layer 70 may be formed by alternately stacking one or more organic layers and one or more inorganic layers.

A plurality of inorganic layers or a plurality of organic layers may be provided.

The organic layer of the encapsulation layer 70 may include a polymer material, and may be a single layer or a layer stack formed of any one of polyethylene terephthalate, polyimide, polycarbonate, epoxy, polyethylene, and polyacrylate. The organic layer may include polyacrylate, and in more detail, may include a polymerized monomer composition including diacrylate-based monomer and triacrylate-based monomer. The monomer composition may further include monoacrylate-based monomer. Also, the monomer composition may further include a photo-initiator, such as trimethyl benzoyl diphenyl phosphine oxide (TPO), but the present invention is not limited thereto.

The inorganic layer of the encapsulation layer 70 may be a single layer or a layer stack including a metal oxide and/or a metal nitride. In more detail, the inorganic layer may include any one of SiNx, $Al_2O_3$, $SiO_2$, and $TiO_2$.

The top layer of the encapsulation layer 70, which is exposed to the outside, may include an inorganic layer in order to prevent or substantially prevent intrusion of moisture into the intermediate layer 63.

The encapsulation layer 70 may include at least one sandwich structure in which at least one organic layer is inserted between at least two inorganic layers. In another example, the encapsulation layer 70 may include at least one sandwich structure in which at least one inorganic layer is inserted between at least two organic layers.

The encapsulation layer 70 may include a first inorganic layer, a first organic layer, and a second inorganic layer sequentially formed from a top surface of the second electrode 62. In another example, the encapsulation layer 70 may include a first inorganic layer, a first organic layer, a second inorganic layer, a second organic layer, and a third inorganic layer sequentially formed from the top surface of the second electrode 62. In another example, the encapsulation layer 70 may include a first inorganic layer, a first organic layer, a second inorganic layer, a second organic layer, a third inorganic layer, a third organic layer, and a fourth inorganic layer sequentially formed from the top surface of the second electrode 62.

A halogenized metal layer including lithium fluoride (LiF) may be additionally included between the second electrode 62 and the first inorganic layer. The halogenized metal layer may prevent or substantially prevent damage to the second electrode 62 when the first inorganic layer is formed.

The first organic layer may be smaller than the second inorganic layer, and the second organic layer may be smaller than the third inorganic layer.

In another example, the first organic layer may be completely covered by the second inorganic layer, and the second organic layer may be completely covered by the third inorganic layer.

The encapsulation layer 70 may be formed using the plasma-enhanced chemical vapor deposition device 100. That is, the substrate S on which the second electrode 62 is formed may be deposited on the susceptor 140 of the plasma-enhanced chemical vapor deposition device 100, so that a vapor deposition process may be performed and the encapsulation layer may be formed.

Thus, when the plasma-enhanced chemical vapor deposition device 100 is used, the display apparatus 10 may rapidly form an insulating layer having a desired thickness, other conductive layers, and in particular, an insulating layer that is desirably formed thicker than an electrode, such as the encapsulation layer 70.

As described above, according to one or more exemplary embodiments, an arcing phenomenon may be prevented or substantially prevented from occurring between a mask unit and a substrate during a deposition process, so that the effects of increasing a deposition process speed, improving the quality of thin layers, and extending a period for replacing the mask unit may be achieved.

It should be understood that the exemplary embodiments described herein should be considered in a descriptive sense only, and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein, without departing from the spirit and scope as defined by the following claims, and their equivalents.

What is claimed is:

1. A plasma-enhanced chemical vapor deposition device comprising:
   a sprayer configured to spray a gas onto a substrate;
   a lift configured to support a mask comprising a pattern through which the gas is able to pass, and configured to raise or lower the mask; and
   a susceptor configured to support the substrate for depositing the gas, and configured to raise or lower the substrate,
   wherein the susceptor comprises a first ground configured to electrically contact the mask during a deposition process during which the gas is deposited on the substrate.

2. The plasma-enhanced chemical vapor deposition device of claim 1, further comprising a second ground configured to be electrically connected to the susceptor, and configured to discharge charges of the susceptor to the outside using the first ground.

3. The plasma-enhanced chemical vapor deposition device of claim 1, wherein at least one of the lift and the susceptor is configured to linearly move with respect to each other.

4. The plasma-enhanced chemical vapor deposition device of claim 1, further comprising a support pin configured to support the substrate, and configured to raise or lower the substrate,
   wherein the susceptor comprises a support pin through hole through which the support pin passes.

5. The plasma-enhanced chemical vapor deposition device of claim 1, wherein the susceptor comprises a lift through hole through which the lift passes.

6. The plasma-enhanced chemical vapor deposition device of claim 5, wherein the lift is configured to move in a first direction that is an ascending/descending direction of the lift with respect to the susceptor, and is configured to move in at least one of a second direction that crosses the first direction or a third direction that crosses the second direction.

7. The plasma-enhanced chemical vapor deposition device of claim 1, wherein the lift comprises a plurality of lifts, and a pair of the plurality of lifts is configured to move in a first direction that is an ascending/descending direction of the lift with respect to the susceptor, and is configured to move in at least one of a second direction that crosses the first direction or a third direction that crosses the first and second directions.

8. The plasma-enhanced chemical vapor deposition device of claim 7, wherein another pair of the plurality of lifts is configured to move in the first direction.

9. The plasma-enhanced chemical vapor deposition device of claim 1, further comprising a second ground configured to be electrically connected to the susceptor to discharge charges provided to the susceptor from the mask to the outside using the first ground.

10. The plasma-enhanced chemical vapor deposition device of claim 1, wherein the first ground comprises a conductive material.

11. The plasma-enhanced chemical vapor deposition device of claim 1, wherein the first ground comprises a ceramic and a conductive material, and the conductive material is configured to electrically contact the mask.

12. The plasma-enhanced chemical vapor deposition device of claim 1, wherein the susceptor further comprises an installation groove in which the first ground is installed.

13. The plasma-enhanced chemical vapor deposition device of claim 12, wherein the susceptor further comprises an elastic body configured to be in the installation groove, and configured to allow the first ground to be elastically moved in an ascending/descending direction of the susceptor.

14. A method of manufacturing a display apparatus, the method comprising:
   loading a substrate into a chamber including a plasma region;
   supplying a gas into the chamber;
   forming a radical in the chamber when the gas passes through the plasma region; and
   forming a deposition layer on the substrate when the radical reacts on the substrate while a mask electrically contacts a first ground.

15. The method of claim 14, wherein the deposition layer comprises an insulating layer.

16. The method of claim 14, further comprising aligning the substrate and the mask with each other.

17. The method of claim 16, further comprising:
   moving the mask in a first direction; and
   moving the mask in at least one of a second direction that crosses the first direction, or a third direction that crosses the first and second directions, to align the substrate and the mask.

18. The method of claim 14, wherein the forming of the deposition layer on the substrate comprises contacting the substrate to the mask.

19. The method of claim 18, wherein, when the substrate and the mask contact each other, one end of a lift contacts one surface of the mask that contacts the substrate.

20. The method of claim 18, wherein one end of a lift that contacts the mask and one end of the first ground that contacts the mask are positioned at corresponding heights.

* * * * *